United States Patent
Kim et al.

(10) Patent No.: US 9,947,809 B2
(45) Date of Patent: *Apr. 17, 2018

(54) CONDUCTIVE PASTE AND ELECTRONIC DEVICE AND SOLAR CELL INCLUDING AN ELECTRODE FORMED USING THE CONDUCTIVE PASTE

(71) Applicant: Samsung Electronics Co., Ltd., Suwon-si, Gyeonggi-do (KR)

(72) Inventors: Se Yun Kim, Seoul (KR); Suk Jun Kim, Suwon-si (KR); Eun Sung Lee, Hwaseong-si (KR); Sang Soo Jee, Hwaseong-Si (KR); Jeong Na Heo, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 579 days.

This patent is subject to a terminal disclaimer.

(21) Appl. No.: 13/673,359

(22) Filed: Nov. 9, 2012

(65) Prior Publication Data

US 2013/0118572 A1    May 16, 2013
US 2018/0019350 A9    Jan. 18, 2018

Related U.S. Application Data

(63) Continuation-in-part of application No. 12/943,732, filed on Nov. 10, 2010.

(30) Foreign Application Priority Data

Nov. 11, 2009  (KR) .................. 10-2009-0108674
Oct. 4, 2010   (KR) .................. 10-2010-0096382
Nov. 11, 2011  (KR) .................. 10-2011-0117882

(51) Int. Cl.
    *H01L 31/00*   (2006.01)
    *H01L 21/00*   (2006.01)
    (Continued)

(52) U.S. Cl.
    CPC ........ *H01L 31/0224* (2013.01); *B22F 1/0059* (2013.01); *B23K 35/025* (2013.01);
    (Continued)

(58) Field of Classification Search
    CPC ............................................. H01L 31/022441
    (Continued)

(56) References Cited

U.S. PATENT DOCUMENTS 4,434,084 A    2/1984   Hicks et al.
5,170,930 A    12/1992  Dolbear et al.
(Continued)

FOREIGN PATENT DOCUMENTS

CN    102132422 A    7/2011
EP    1480233 A1     11/2004
(Continued)

OTHER PUBLICATIONS

Gunnar Schubert, "Thick Film Metallisation of Crystalline Silicon Solar Cells: Mechanisms, Models and Applications," Ph.D. Dissertation, Univ. Konstanz, 2006. http://kops.uni-konstanz.de/handle/123456789/9378.*

(Continued)

*Primary Examiner* — Angelo Trivisonno
(74) *Attorney, Agent, or Firm* — Harness, Dickey & Pierce, P.L.C.

(57) ABSTRACT

A conductive paste includes a conductive powder, a metallic glass having a glass transition temperature of less than or equal to about 600° C. and a supercooled liquid region of greater than or equal to 0 K, and an organic vehicle, and an electronic device and a solar cell include an electrode formed using the conductive paste.

35 Claims, 11 Drawing Sheets

(51) Int. Cl.

| | | |
|---|---|---|
| H01B 1/02 | (2006.01) | |
| H01J 1/14 | (2006.01) | |
| H01B 1/22 | (2006.01) | |
| H01L 31/0224 | (2006.01) | |
| H01L 31/18 | (2006.01) | |
| C22C 21/00 | (2006.01) | |
| B22F 1/00 | (2006.01) | |
| C22C 45/00 | (2006.01) | |
| C22C 45/08 | (2006.01) | |
| B23K 35/28 | (2006.01) | |
| B23K 35/30 | (2006.01) | |
| B23K 35/02 | (2006.01) | |
| H01L 31/068 | (2012.01) | |
| B22F 3/10 | (2006.01) | |

(52) U.S. Cl.
CPC ...... *B23K 35/0244* (2013.01); *B23K 35/0261* (2013.01); *B23K 35/286* (2013.01); *B23K 35/302* (2013.01); *B23K 35/3006* (2013.01); *B23K 35/3033* (2013.01); *C22C 21/00* (2013.01); *C22C 45/00* (2013.01); *C22C 45/08* (2013.01); *H01B 1/22* (2013.01); *H01L 31/022425* (2013.01); *H01L 31/0682* (2013.01); *H01L 31/18* (2013.01); *B22F 3/10* (2013.01); *Y02E 10/547* (2013.01)

(58) Field of Classification Search
USPC .......................................................... 136/256
See application file for complete search history.

(56) References Cited

U.S. PATENT DOCUMENTS

| | | | |
|---|---|---|---|
| 5,271,962 | A | 12/1993 | Alexander |
| 6,120,586 | A | 9/2000 | Harada et al. |
| 6,420,042 | B1 | 7/2002 | Sakamoto et al. |
| 6,530,998 | B1 | 3/2003 | Oofune |
| 7,473,278 | B2 | 1/2009 | Hunter et al. |
| 7,794,553 | B2 | 9/2010 | Duan et al. |
| 7,888,168 | B2 | 2/2011 | Weidman et al. |
| 8,075,712 | B2 | 12/2011 | Farmer |
| 8,129,212 | B2 | 3/2012 | Wijekoon et al. |
| 8,168,886 | B2 | 5/2012 | Akimoto |
| 8,207,005 | B2 | 6/2012 | Weidman et al. |
| 2003/0178057 | A1* | 9/2003 | Fujii et al. ................... 136/256 |
| 2005/0211340 | A1 | 9/2005 | Kim et al. |
| 2006/0137778 | A1 | 6/2006 | Munir et al. |
| 2007/0034305 | A1 | 2/2007 | Suh |
| 2008/0146016 | A1 | 6/2008 | Schwirtlich et al. |
| 2008/0251164 | A1* | 10/2008 | Lohwongwatana et al. . 148/528 |
| 2010/0021704 | A1 | 1/2010 | Yoon et al. |
| 2010/0037990 | A1 | 2/2010 | Suh |
| 2010/0055822 | A1* | 3/2010 | Weidman .............. G01T 1/2018 438/57 |
| 2010/0170562 | A1 | 7/2010 | Akimoto |
| 2010/0227433 | A1 | 9/2010 | Konno |
| 2010/0269893 | A1* | 10/2010 | Prince .................. B23K 1/0016 136/252 |
| 2010/0289005 | A1 | 11/2010 | Cowell, III et al. |
| 2011/0000531 | A1 | 1/2011 | Kwag et al. |
| 2011/0104850 | A1 | 5/2011 | Weidman et al. |
| 2011/0114170 | A1* | 5/2011 | Lee ........................ H01B 1/22 136/256 |
| 2011/0183458 | A1 | 7/2011 | Weidman et al. |
| 2011/0192457 | A1 | 8/2011 | Nakayama et al. |
| 2011/0272625 | A1 | 11/2011 | Wijekoon et al. |
| 2012/0031481 | A1 | 2/2012 | Jee et al. |
| 2012/0037223 | A1 | 2/2012 | Yamanaka et al. |
| 2012/0240994 | A1 | 9/2012 | Kim et al. |

FOREIGN PATENT DOCUMENTS

| | | |
|---|---|---|
| EP | 2 325 848 | 5/2011 |
| JP | 08-064029 A | 3/1996 |
| JP | 2003-217347 A | 7/2003 |
| JP | 2004-250308 A | 9/2004 |
| JP | 2005-093391 | 4/2005 |
| JP | 2008-159917 A | 7/2008 |
| JP | 2009-087957 | 4/2009 |
| JP | 2009099371 A | 5/2009 |
| JP | 2009138266 A | 6/2009 |
| JP | 2010018878 A | 1/2010 |
| JP | 2010-238570 A | 10/2010 |
| JP | 2011-103301 A | 5/2011 |
| KR | 10-1998-057847 A | 9/1998 |
| KR | 1998-0057847 A | 9/1998 |
| KR | 10-2002-0037772 A | 5/2002 |
| KR | 10-2004-0080522 A | 9/2004 |
| KR | 10-2005-0096258 A | 10/2005 |
| KR | 10-0720940 B1 | 5/2007 |
| KR | 10-2007-0106887 A | 11/2007 |
| KR | 10-2008-0025762 | 3/2008 |
| KR | 10-2008-0029655 A | 4/2008 |
| KR | 10-2008-0029826 A | 4/2008 |
| KR | 10-2009-0115252 | 11/2009 |
| KR | 10-2010-0028493 A | 3/2010 |
| KR | 10-2010-0048196 A | 5/2010 |
| KR | 10-2010-0133867 A | 12/2010 |
| KR | 10 2011-0003803 | 1/2011 |
| KR | 10 2011 0098549 | 1/2011 |
| KR | 10 2011-0040090 | 4/2011 |
| KR | 10-2011-0052452 A | 5/2011 |
| KR | 10-2011-0112768 A | 10/2011 |
| WO | WO-01/031085 A2 | 5/2001 |

OTHER PUBLICATIONS

Hu et al., "Crystallization kinetics of Ca65Mg15Zn20 bulk metallic glass," Journal of Alloys and Compounds 557 (2013) 160-165.*
Lohwongwatana, Boonrat (2007) Development, characterization, and applications of gold and platinum bulk metallic glasses. Dissertation (Ph.D.), California Institute of Technology. http://resolver.caltech.edu/CaltechETD:etd-05212007-043942.*
Suh et al., "Novel thermoplastic bonding using a bulk metallic glass solder," Scripta Materialia 59 (2008) 905-908.*
Wang, "The elastic properties, elastic models and elastic perspectives of metallic glasses," Progress in Materials Science 57 (2012) 487-656.*
Schubert, "Thick Film Metallisation of Crystalline Silicon Solar Cells: Mechanisms, Models and Applications," Ph.D. Dissertation, Univ. Konstanz, 2006. http://kops.uni-konstanz.de/handle/123456789/9378.*
K. Nakamura et al. "Development of 20% Efficiency Mass Production Si Solar Cells"; 20th European Photovoltaic Solar Energy Conference; Barcelona, Spain; Jun. 2005.
B Hoex et al. "On the c-Si surface passivation mechanism by the negative-chargedielectric Al2O3"; Journal of Applied Physics 104, 113703; 2008.
PCT Search Report dated Mar. 18, 2013 for PCT/KR2012-009528.
Office Action for corresponding U.S. Appl. No. 13/416,260 dated Aug. 1, 2014.
V. Martinac "Effect of TiO$_2$ Addition on the Sintering Process of Magnesium Oxide from Seawater"; Sintering of Ceramics—New Emerging Techniques, p. 309-322; Mar. 2012.
Hilali M.M. et al. "Effect of Ag particle size in thick-film Ag paste on the electrical and physical properties of screen printed contacts and silicon solar cells"; *Journal of the Electrochemical Society*, 153, (1) A5-A11, (2006).
Schubert G. et al., "Current Transport Mechanism in Printed AG Thick Film Contacts to An N-Type Emitter of a Crystalline Silicon Solar Cell," Proceedings of the 19th European Photovoltaic Solar Energy Conference, 813-816 (Paris, 2004).
U.S. Office Action for corresponding U.S. Appl. No. 13/534,799 dated Dec. 23, 2014.

(56) References Cited

OTHER PUBLICATIONS

Chinese Office Action dated Sep. 21, 2015 issued in corresponding Chinese Application No. 201280017966.5 (English translation provided).
Gunnar Schubert, "Thick Film Metallisation of Crystalline Silicon Solar Cells: Mechanisms, Models and Applications," Ph.D. Dissertation, Univ. Konstanz, Chapters 5-8, (2006).
U.S. Office Action for corresponding U.S. Appl. No. 13/534,799 dated Jun. 3, 2015.
Extended European Search Report dated May 13, 2016 issued in corresponding European Patent Application No. 12847137.2.
Japanese Office Action dated Sep. 13, 2016 issued in corresponding Japanese Patent Application No. JP 2014-540960 (English translation provided).
U.S. Office Action dated Aug. 26, 2015 issued in U.S. Appl. No. 13/759,475.
Korean Office Action dated May 30, 2017 issued in corresponding Korean Application No. 10-2011-0027011 (English translation provided).

\* cited by examiner

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application is a continuation-in-part of U.S. application Ser. No. 12/943,732, filed in the USPTO on Nov. 10, 2010, which claims priority under 35 U.S.C. § 119 to Korean Patent Application Nos. 10-2009-0108674 and 10-2010-0096382, filed in the Korean Intellectual Property Office on Nov. 11, 2009 and Oct. 4, 2010, respectively. This application also claims priority under 35 U.S.C. § 119 to Korean Patent Application No. 10-2011-0117882 filed in the Korean Intellectual Property Office on Nov. 11, 2011. The entire contents of each of the above-discussed applications are incorporated herein by reference.

BACKGROUND

1. Field

Example embodiments relate to a conductive paste, and an electronic device and/or a solar cell including at least one electrode formed using the conductive paste.

2. Description of the Related Art

A solar cell is a photoelectric conversion device that transforms light (e.g., solar energy) into electrical energy. Solar cells have attracted much attention as a potentially infinite and pollution-free next generation energy source.

A solar cell may include p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes.

A solar cell desirably has as high efficiency as possible for producing electrical energy from solar energy. In order to improve this efficiency, the solar cell desirably produces as many electron-hole pairs as possible and then collects the produced charges without loss as well as desirably absorbs light with less loss.

An electrode for a solar cell may be fabricated using a deposition method. Some deposition methods may be complicated, may have a high cost, and/or may take a relatively long time. Accordingly, a simpler method, e.g., screen-printing a conductive paste including a conductive material, has been suggested.

However, when an electrode is fabricated by using a conductive paste, the conductive paste generally may need to be fired at a relatively high temperature of about 900° C. The firing at a higher temperature may deteriorate a passivation layer disposed beneath or on the electrode, and thus deteriorate efficiency.

SUMMARY

Example embodiments relate to a conductive paste being capable of improving the efficiency of a device.

Example embodiments also relate to an electronic device including at least one electrode fabricated by using the conductive paste.

Example embodiments also relate to a solar cell including at least one electrode fabricated by using the conductive paste.

According to example embodiments, a conductive paste may include a conductive powder, a metallic glass having a glass transition temperature of less than or equal to about 600° C. and a supercooled liquid region of greater than or equal to 0 K, and an organic vehicle.

In example embodiments, the metallic glass may have a glass transition temperature ranging from about 10 to about 400° C.

In example embodiments, the metallic glass may have a supercooled liquid region ranging from about 0 to about 200 K.

In example embodiments, the metallic glass may exist at least partly in an amorphous state.

In example embodiments, the metallic glass may include at least one an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, and a platinum-based metallic glass.

In example embodiments, the at least one of the aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may be an alloy including aluminum, cerium, strontium, gold, ytterbium, zinc, calcium, magnesium, platinum, palladium, and zirconium as a main component, respectively. In example embodiments, the at least one of the aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may further include at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), and mercury (Hg).

In example embodiments, the conductive powder may include silver (Ag), aluminum (Al), copper (Cu), nickel (Ni), or a combination thereof.

In example embodiments, the conductive powder, the metallic glass, and the organic vehicle may be respectively included in an amount of about 30 to about 99 wt %, about 0.1 to about 20 wt %, and a balance based on the total amount of the conductive paste.

According to example embodiments, an electronic device may include an electrode formed by the sintering the conductive paste.

In example embodiments, the electronic device may be a flexible electronic device.

In example embodiments, the electrode may not have a glass transition temperature (Tg).

In example embodiments, the electrode may further include at least one of crystalline powder and a glass frit. The at least one of the glass frit and the crystalline powder may contain an element that is the same as an element of the metallic glass.

In example embodiments, the electrode may have a contact resistance of less than or equal to about 1 kΩcm².

In example embodiments, the electrode may have a resistivity less than or equal to about 10 mΩcm.

According to example embodiments, an electronic device may include an electrode formed by sintering a conductive paste. The electrode may not have a glass transition temperature (Tg).

In example embodiments, the conductive paste sintered to form the electrode may include at least one of an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, a platinum-based metallic glass, a palladium-based metallic glass, and a zirconium-based metallic glass.

In example embodiments, the at least one of the aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may be an alloy including aluminum, cerium, strontium, gold, ytterbium, zinc, calcium, magnesium, platinum, palladium, and zirconium as a main component, respectively, In example embodiments, the at least one of the aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may further include at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), and mercury (Hg).

In example embodiments, the electrode may have a contact resistance of less than or equal to about 1 kΩcm² and a resistivity less than or equal to about 10 mΩcm. In example embodiments, the electronic device may include a solar cell.

According to example embodiments, a solar cell may include a semiconductor substrate, and at least one electrode electrically connected to the semiconductor substrate. The at least one electrode may be formed by sintering the foregoing conductive paste.

In example embodiments, the at least one electrode may include first and second electrodes having different conductive types. The first electrode and the second electrode may be respectively positioned on the rear side of the semiconductor substrate.

In example embodiments, the solar cell may further include a passivation layer on the rear side of the semiconductor substrate.

In example embodiments, the at least one electrode may include a buffer portion positioned in a first region adjacent to the semiconductor substrate and an electrode portion positioned in a second region located where the buffer portion is not formed, the electrode portion including a conductive material. In example embodiments, the buffer portion may be conductive.

In example embodiments, the conductive paste may include at least one of an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, a platinum-based metallic glass, a palladium-based metallic glass, and a zirconium-based metallic glass.

In example embodiments, the at least one of aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may be an alloy including aluminum, cerium, strontium, gold, ytterbium, zinc, calcium, magnesium, platinum, palladium, and zirconium as a main component, respectively. In example embodiments, the at least one of the aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and zirconium-based metallic glass may further include at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), and mercury (Hg).

In example embodiments, the electrode may have a contact resistance of less than or equal to about 1 kΩcm².

In example embodiments, the electrode may have a resistivity less than or equal to about 10 mΩcm.

In example embodiments, the electrode may not have a glass transition temperature (Tg).

In example embodiments, the conductive paste may include at least one of a glass frit and a crystalline powder. In example embodiments, the at least one of the glass frit and the crystalline powder may contain an element that is the same as an element of the metallic glass.

According to example embodiments, a conductive paste may include a conductive powder, a metallic glass having a glass transition temperature of less than or equal to about 350° C. and a supercooled liquid region of greater than or equal to about 0 K, and an organic vehicle.

In example embodiments, the metallic glass may include at least one of an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, a platinum-based metallic glass, a palladium-based metallic glass, and a zirconium-based metallic glass.

In example embodiments, the conductive powder and the metallic glass, and may be respectively included in an amount of about 30 wt % to about 99 wt %, about 0.1 wt % to about 20 wt %, and a balance of the conductive paste may include the organic vehicle.

According to example embodiments, a method of making an electrode may include: depositing a conductive paste on a semiconductor substrate; and heating the conductive paste on the semiconductor substrate in a furnace at a process temperature that is greater than the glass transition temperature of the conductive paste and less than or equal to about 600° C. The conductive paste may include a conductive powder and a metallic glass dispersed in an organic vehicle. The metallic glass may have a glass transition temperature of less than or equal to about 600° C. and a supercooled liquid region of greater than or equal to about 0 K.

In example embodiments, the heating the conductive paste on the semiconductor substrate may include converting an amorphous portion of the metallic glass into a crystalline portion of the metallic glass.

In example embodiments, the glass transition temperature of the metallic glass may be less than or equal to about 400° C., In example embodiments, the supercooled liquid region of the metallic glass may be greater than 0 K and less than or equal to about 200 K.

The depositing the conductive paste on the semiconductor substrate may include screen printing the conductive paste onto the semiconductor substrate, and the semiconductor substrate may be part of a solar cell.

In example embodiments, the semiconductor substrate may be silicon.

In example embodiments, the metallic glass may include at least one of an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, a platinum-based metallic glass, a palladium-based metallic glass, and a zirconium-based metallic glass.

BRIEF DESCRIPTION OF THE DRAWINGS

The foregoing and other features and advantages of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating principles of example embodiments. In the drawings.

DETAILED DESCRIPTION

Figure 1:
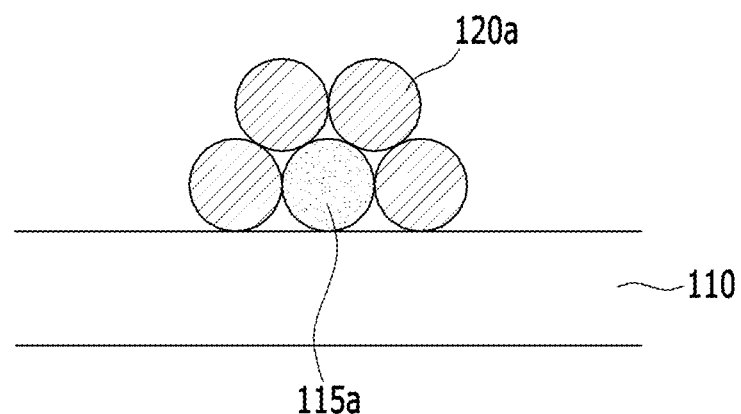
FIGS. 1 to 4 are schematic diagrams showing a process in which a conductive paste according to example embodiments is applied on a semiconductor substrate, and then heated and transformed by the heat.

Example embodiments will hereinafter be described in further detail with reference to the accompanying drawings, in which various embodiments are shown. This disclosure may, however, be embodied in many different forms and should not be construed as limited to the embodiments set forth herein; rather, these example embodiments are provided so that this disclosure will be thorough and complete, and will fully convey the scope of example embodiments to those of ordinary skill in the art. In the drawings, the thickness of layers, films, panels, regions, etc., are exaggerated for clarity. Like reference numerals designate like elements throughout the specification, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Hereinafter, the term "element" refers to a metal and a semimetal.

A conductive paste according to example embodiments may include a conductive powder, a metallic glass, and an organic vehicle.

The conductive powder may be a silver (Ag)-containing metal (e.g., silver or a silver alloy), an aluminum (Al)-containing metal (e.g., aluminum or an aluminum alloy), a copper (Cu)-containing metal (e.g., copper (Cu) or a copper alloy), a nickel (Ni)-containing metal (e.g., nickel (Ni) or a nickel alloy), or a combination thereof. However, in example embodiments, the conductive powder is not limited thereto and may include other metals and/or an additive other than the metals.

The conductive powder may have a size (e.g., an average largest particle size) ranging from about 0.1 nanometers (nm) to about 50 micrometers (µm). The conductive powder may be particles having a substantially spherical shape. However, example embodiments are not limited thereto and the conductive powder may alternatively be a non-spherical shape (e.g., flakes).

The conductive powder may be included in an amount of about 30 to about 99 wt %, based on the total amount of the conductive paste.

The metallic glass includes an alloy having a disordered atomic structure including two or more metals, and is also referred to as an amorphous metal. Since the metallic glass has low resistance that is different from a regular glass such as a silicate, it may be considered an electrical conductor at voltages and currents typically applied to a solar cell.

The metallic glass may be an alloy of transition elements, a noble metal, a rare earth element metal, an alkaline-earth metal, a semimetal, and a combination thereof, and the alloy may include at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), a combination thereof or other materials with similar characteristics.

In one embodiment, the metallic glass may include at least one selected from copper (Cu), zirconium (Zr), nickel (Ni), iron (Fe), titanium (Ti), magnesium (Mg), and a combination thereof.

The metallic glass may include $Cu_{50}Zr_{50}$, $Cu_{30}Ag_{30}Zr_{30}Ti_{10}$, $Cu_{43}Zr_{43}Al_7Ag_7$, $Cu_{46}Zr_{46}Al_8$, $Cu_{58.1}Zr_{35.9}Al_6$, $Ti_{50}Ni_{15}Cu_{32}Sn_3$, $Ti_{45}Ni_{15}Cu_{25}Sn_3Be_7Zr_5$, $Ni_{60}Nb_{30}Ta_{10}$, $Ni_{61}Zr_{20}Nb_7Al_4Ta_8$, $Ni_{57.5}Zr_{35}Al_{7.5}$, $Zr_{41.2}Ti_{13.8}Ni_{10}Cu_{12.5}Be_{22.5}$, $Mg_{65}Y_{10}Cu_{15}Ag_5Pd_5$, $Mn_{55}Al_{25}Ni_{20}$, $La_{55}Al_{25}Ni_{10}Cu_{10}$, $Mg_{65}Cu_{7.5}Ni_{7.5}Ag_5Zn_5Gd_{10}$, $Mg_{65}Cu_{15}Ag_{10}Y_6Gd_4$, $Fe_{77}Nb_6B_{17}$, $Fe_{67}Mo_{13}B_{17}Y_3$, $Ca_{65}Mg_{15}Zn_{20}$, $Ca_{66.4}Al_{33.6}$, a combination thereof or other materials with similar characteristics, but is not limited thereto.

The metallic glass may be an alloy of greater than or equal to two kinds of metals and/or semi-metals at least partly having an amorphous portion, and may be called an amorphous metal. Herein, the amorphous portion may be about 50 to 100 wt % of the metallic glass, for example, about 70 to 100 wt %, or about 90 to 100 wt %. The metallic glass has relatively low resistivity and a relatively high conductivity, unlike conventional glass (e.g., silicate). The metallic glass may be formed to include an amorphous structure by heating the metallic glass above its melting temperature (Tm) and then using a rapid quenching process to cool the metallic glass. Rapid quenching processes are well known in the art so a detailed description of a rapid quenching process is omitted herein.

The metallic glass may have a glass transition temperature of less than or equal to about 600° C. (and/or less than or equal to about 350° C.) and may have a supercooled liquid region of greater than or equal to 0 K. For example, in example embodiments, the supercooled liquid region of the metallic glass may be between about 0 K to about 200 K, about 0 K to about 100 K, and/or about 6 K to about 90 K.

The metallic glass may be plastically deformed at a glass transition temperature and show a liquid-like behavior. The liquid-like behavior may be maintained in a supercooled liquid region between a glass transition temperature (Tg) and a crystalline temperature ($T_c$).

In example embodiments, when the metallic glass shows a liquid-like behavior, the metallic glass may show wettability against a lower layer and thus enlarge a contact area between the conductive paste and the lower layer.

For example, an electrode for a solar cell formed by applying a conductive paste on a semiconductor substrate according to example embodiments is illustrated referring to FIGS. 1 to 4.

Figure 2:
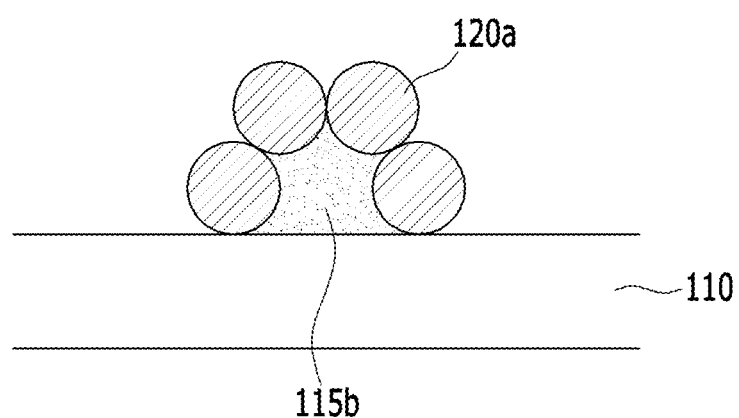
Figure 3:
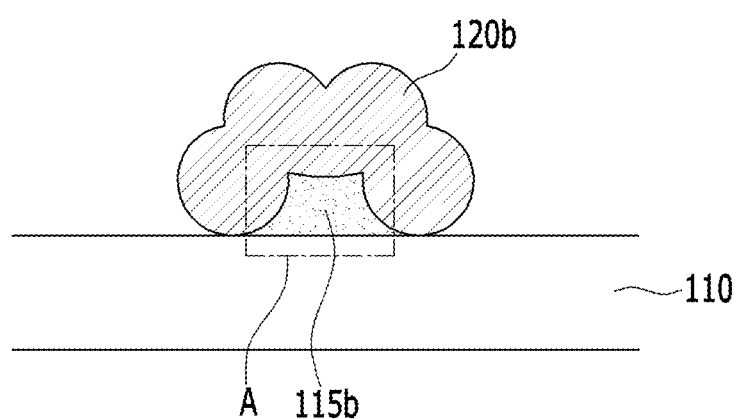
Figure 4:
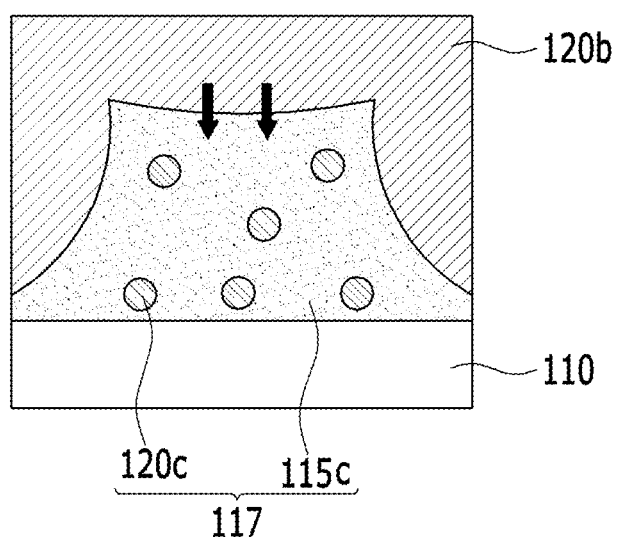

FIGS. 1 to 3 are schematic diagrams showing a process in which a conductive paste according to example embodiments is applied on a semiconductor substrate and then heated and transformed by the heat, and FIG. 4 shows a schematic diagram enlarging the region 'A' shown in FIG. 3.

Referring to FIG. 1, a conductive paste including a conductive powder 120*a* and a metallic glass 115*a* is applied on a semiconductor substrate 110. Herein, the conductive powder 120*a* and the metallic glass 115*a* respectively may be a particle type, respectively.

Referring to FIG. 2, when the conductive paste is heated up to higher than or equal to a glass transition temperature (Tg) of the metallic glass 115*a*, the metallic glass 115*a* may soften and change into a liquid-like metallic glass 115*b*. The liquid-like metallic glass 115*b* has wettability on the semiconductor substrate 110 and thus may contact a larger area of the semiconductor substrate 110.

Referring to FIGS. 3 and 4, when the conductive paste is heated up to higher than or equal to a sintering temperature of a conductive powder 120*a*, the conductive powder 120*a* combines to form a conductive powder chunk 120*b*.

Herein, a portion of the conductive powder 120*a* is diffused into the liquid-like metallic glass 115*b* and forms a solid solution therewith.

Accordingly, as shown in FIG. 4, a desired (and/or alternatively predetermined) buffer portion 117 may be formed between the conductive powder chunk 120*b* and the semiconductor substrate 110. The buffer portion 117 may include a conductive powder component 120*c* and a metallic glass component 115*c*.

Herein, the process shown in FIGS. 2 to 4 may occur at higher than or equal to the glass transition temperature of a metallic glass. Thus, when the glass transition temperature of a metallic glass is lower than a temperature of processing a conductive paste, the conductive paste may have wettability, and form a solid solution and a buffer portion, as aforementioned.

The conductive paste may be generally fired in a furnace at a process temperature of greater than or equal to about 900° C. when applied to form an electrode. However, the firing at a higher temperature may deteriorate a passivation layer or an organic layer for a flexible electronic device, deteriorating efficiency.

According to example embodiments, a conductive paste may include a metallic glass having a glass transition temperature of less than or equal to about 600° C. (and/or less than or equal to about 350° C.) and a supercooled liquid region of greater than or equal to 0 K, and thus may have a sufficient contact area with a lower layer due to the aforementioned wettability, forming of a solid solution and a buffer portion, although fired at a temperature of lower than or equal to about 600° C. Accordingly, the conductive paste may not only secure conductivity of an electrode but also reduce (and/or prevent) degradation of a passivation layer and/or an organic material in a device, and thus reduce (and/or prevent) efficiency deterioration of the device. Herein, the supercooled liquid region of 0 K refers to a case in which a metallic glass partly has a crystal phase, and thus, no clear glass transition temperature.

The metallic glass having a glass transition temperature of less than or equal to about 600° C. and a supercooled liquid region of greater than or equal to 0 K may include, for example, an aluminum-based metallic glass, a cerium-based metallic glass, a strontium-based metallic glass, a gold-based metallic glass, an ytterbium metallic glass, a zinc-based metallic glass, a calcium-based metallic glass, a magnesium-based metallic glass, a platinum-based metallic glass, a palladium-based metallic glass, and a zirconium-based metallic glass, but is not limited thereto.

The aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and a zirconium-based metallic glass may have a glass transition temperature of less than or equal to about 600° C., for example, less than or equal to about 350° C. The metallic glass may have a glass transition temperature from about 10 to about 400° C., for example, about 10 to about 350° C.

The aluminum-based metallic glass, cerium-based metallic glass, strontium-based metallic glass, gold-based metallic glass, ytterbium metallic glass, zinc-based metallic glass, calcium-based metallic glass, magnesium-based metallic glass, platinum-based metallic glass, palladium-based metallic glass, and a zirconium-based metallic glass may be an alloy including each of aluminum, cerium, strontium, gold, ytterbium, zinc, calcium, magnesium, platinum, palladium, and zirconium as a main component, respectively, and further including at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), and mercury (Hg). Herein, the main component refers to a component having the highest mole ratio among the components of the metallic glass.

In example embodiments, the aluminum-based metallic glass may be an alloy containing aluminum and at least one of nickel (Ni), yttrium (Y), cobalt (Co), lanthanum (La), zirconium (Zr), iron (Fe), titanium (Ti), and calcium (Ca). In example embodiments, the cerium-based metallic glass may be an alloy containing cerium and at least one of aluminum (Al), copper (Cu), and niobium (Nb). In example embodiments, the strontium-based metallic glass may be an alloy containing strontium and at least one of magnesium (Mg), lithium (Li), zinc (Zn), and copper (Cu). In example embodiments, the gold-based metallic glass may be an alloy containing gold and at least one of copper (Cu), silicon (Si), silver (Ag), and palladium (Pd). In example embodiments, the ytterbium metallic glass may be an alloy containing ytterbium and at least one of zinc (Zn), magnesium (Mg), copper (Cu), and calcium (Ca); silver (Ag), and mercury (Hg). In example embodiments, the zinc-based metallic glass may be an alloy containing zinc and at least one of strontium (Sr), ytterbium (Yb), magnesium (Mg), copper (Cu), and calcium (Ca), and lithium (Li). In example embodiments, the calcium-based metallic glass may be an alloy containing calcium and at least one of zinc (Zn), magnesium (Mg), ytterbium (Yb), and lithium (Li). In example embodiments, the magnesium-based metallic glass may be an alloy containing magnesium and at least one of strontium (Sr), zinc (Zn), lithium (Li), copper (Cu), zinc (Zn), ytterbium (Yb), calcium (Ca), and yttrium (Y). In example embodiments, the platinum-based metallic glass may be an alloy containing platinum and at least one of nickel (Ni), copper (Cu), and phosphorus (P). In example embodiments, the palladium-based metallic glass may be an alloy containing palladium and at least one of nickel (Ni), copper (Cu), and phosphorus (P). In example embodiments, the zirconium-based metallic glass may be an alloy containing zirconium and at least one of titanium (Ti), beryllium (Be), copper (Cu), cobalt (Co), iron (Fe), and nickel (Ni).

In example embodiments, the aluminum-based metallic glass may contain about 84 at % to about 90 at % aluminum (Al) inclusive, and may further contain at least one of nickel (Ni), cobalt (Co), and iron (Fe), and at least one of yttrium (Y), lanthanum (La), and zirconium (Zr). In example embodiments, the cesium-based metallic glass may be represented by the chemical formula $Ce_{70-a}Cu_{20}Al_{10}Nb_a$ where a is about 0 at % to about 2 at % inclusive. In example embodiments, the strontium-based metallic glass may be represented by the formula $Sr_{60-x}Yb_xMg_{20-y}Li_yZn_{20-z}Cu_z$, where x is about 0 at % to about 20 at % inclusive, y is about 0 at % to about 11 at % inclusive, and z is about 0 at % to about 5 at % inclusive. The gold-based metallic glass may contain about 50 at % to about 70 at % gold (Au) inclusive, and may further contain copper (Cu), and at least one of silicon (Si), silver (Ag), and palladium (Pd), In example embodiments, the ytterbium-based glass may contains about 60 at % to about 70 at % ytterbium (Yb) inclusive, and may further contain about 15 at % to about 20 at % zinc (Zn) inclusive, and a balance including at least one of magnesium (Mg) and copper (Cu). In example embodiments, the zinc-based metallic glass may be represented by the chemical formula $Zn_{40}Mg_{11}Ca_{35-n}Yb_n$ where n is about 0 at % to about 4 at % inclusive. In example embodiments, the calcium-based metallic glass may contains about 65 at % calcium (Ca), and may further contain at least two of magnesium (Mg), lithium (Li), and zinc (Zn). In example embodiments, the magnesium-based metallic glass may be $Mg_{65}Cu_{25}Y_{10}$. In example embodiments, the platinum-based metallic glass may be $Pt_{57.5}Cu_{14.7}Ni_{5.3}P_{22.5}$ and $Pt_{60}Ni_{15}P_{25}$.

In example embodiments, the aluminum-based metallic glass may be selected from the group consisting of $Al_{86}Ni_8Y_6$, $Al_{84.5}Ni_{5.5}Y_{10}$, $Al_{89}Co_6La_5$, $Al_{89.5}Co_{3.5}Y_7$, $Al_{88}Co_4Y_8$, $Al_{86.5}Co_{4.5}Y_9$, $Al_{85}Co_5Y_{10}$, $Al_{90}Fe_5La_5$, $Al_{88}Fe_5Y_7$, $Al_{88}Ni_8La_4$, $Al_{88}Ni_7La_5$, $Al_{86}Ni_9La_4$, $Al_{87}Ni_8La_5$, $Al_{86}Ni_8La_5$, $Al_{86}Ni_8La_6$, $Al_{85}Ni_{10}La_5$, $Al_{84}Ni_{11}La_5$, $Al_{84}Ni_{10}La_6$, $Al_{87.5}Fe_5Y_7Ti_{0.5}$, $Al_{87}Fe_5Y_7Ti_1$, $Al_{86}Fe_5Y_7Ti_2$, $Al_{85}Ni_5Y_8Co_2$, $Al_{86}Ni_8Y_{4.5}La_{1.5}$, $Al_{85}Ni_5Y_8Co_2$, $Al_{86}Ni_6Y_{4.5}Co_2La_{1.5}$, $Al_{86}Ni_7Y_5Co_1La_1$, $Al_{86}Ni_7Y_{4.5}Co_1La_{1.5}$, $Al_{87}Ni_{10}Zr_3$, $Al_{86}Ni_{10}Zr_4$, $Al_{86}Ni_9Zr_5$, $Al_{85}Ni_{10}Zr_5$, $Al_{82}Zr_5Ni_{13}$, and $(Al_{86}Ni_9La_5)_{98}Zr_2$. In example embodiments, the strontium-based metallic glass is selected from the group consisting of $Sr_{60}Mg_{18}Zn_{22}$, $Sr_{60}Li_{11}Mg_9Zn_{20}$, $Sr_{60}Li_5Mg_{15}Zn_{20}$, $Sr_{60}Mg_{20}Zn_{15}Cu_5$, and $Sr_{40}Yb_{20}Mg_{20}Zn_{15}Cu_5$. In example embodiments, the gold-based metallic glass may be selected from the group consisting of $Au_{50}Cu_{33}Si_{17}$, $Au_{50}Cu_{25.5}Ag_{7.5}Si_{17}$, $Au_{60}Cu_{15.5}Ag_{7.5}Si_{17}$, $Au_{65}Cu_{10.5}Ag_{7.5}Si_{17}$, $Au_{70}Cu_{5.5}Ag_{7.5}Si_{17}$, and $Au_{49}Cu_{26.9}Ag_{5.5}Pd_{2.3}Si_{16.3}$. In example embodiments, the zinc-based metallic glass may be selected from the group consisting of $Zn_{40}Mg_{11}Ca_{31}Yb_{18}$, and $Zn_{40}Mg_{11}Ca_{35}Yb_{14}$. In example embodiments, the calcium-based metallic glass may be selected from the group consisting of $Ca_{65}Mg_{15}Zn_{20}$, and $Ca_{65}Li_{9.96}Mg_{8.54}Zn_{16.5}$. In example embodiments, the magnesium-based metallic glass may be $Mg_{65}Cu_{25}Y_{10}$. In example embodiments, the platinum-based metallic glass may be selected from the group consisting of $Pt_{57.5}Cu_{14.7}Ni_{5.3}P_{22.5}$ and $Pt_{60}Ni_{15}P_{25}$. In example embodiments, the palladium-based metallic glass may be $Pd_{43}Ni_{10}Cu_{27}P_{20}$. In example embodiments, the zirconium-based metallic glass may be selected from the group consisting of $Zr_{35}Ti_{30}Be_{30}Cu_5$, $Zr_{35}Ti_{30}Be_{27.5}Cu_{7.5}$, $Zr_{35}Ti_{30}Be_{26.75}Cu_{8.25}$, $Zr_{54}Ti_{11}Be_{22.5}Cu_{12.5}$, $Zr_{54}Ti_{11}Be_{17.5}Cu_{17.5}$, $Zr_{51}Ti_9Be_{27.5}Cu_{12.5}$, $Zr_{51}Ti_9Be_{25}Cu_{15}$, $Zr_{40}Ti_{25}Be_{29}Cu_6$, $Zr_{40}Ti_{25}Be_{27}Cu_8$, $Zr_{40}Ti_{25}Be_{25}Cu_{10}$, $Zr_{27.5}Ti_{35}Be_{29.5}Cu_8$, $Zr_{32.5}Ti_{30}Be_{31.5}Cu_6$, $Zr_{32.5}Ti_{30}Be_{29.5}Cu_8$, $Zr_{32.5}Ti_{30}Be_{27.5}Cu_{10}$, $Zr_{37.5}Ti_{25}Be_{27.5}Cu_{10}$, $Zr_{30}Ti_{30}Be_{32}Cu_8$, $Zr_{30}Ti_{30}Be_{30}Cu_{10}$, $Zr_{35}Ti_{25}Be_{32}Cu_8$, $Zr_{35}Ti_{25}Be_{30}Cu_{10}$, $Zr_{35}Ti_{25}Be_{28}Cu_{12}$, $Zr_{40}Ti_{20}Be_{26.25}Cu_{13.75}$, $Zr_{35}Ti_{30}Be_{33}Co_2$, $Zr_{35}Ti_{30}Be_{31}Co_4$, $Zr_{35}Ti_{30}Be_{29}Co_6$, $Zr_{35}Ti_{30}Be_{33}Fe_2$, $Zr_{35}Ti_{30}Be_{31}Fe_4$, $Zr_{35}Ti_{30}Cu_{7.5}Be_{27.5}$, and $Zr_{41.2}Ti_{13.8}Ni_{10}Cu_{12.5}Be_{22.5}$.

Table 1 shows glass transition temperatures, crystalline temperatures, and supercooled liquid regions of aluminum-based metallic glasses that may be used in conductive pastes according to example embodiments.

TABLE 1

| Metallic glass | Tg (° C.) | Tc (° C.) | ΔTx (K) | Metallic glass | Tg (° C.) | Tc (° C.) | ΔTx (K) |
|---|---|---|---|---|---|---|---|
| $Al_{86}Ni_8Y_6$ | 225 | 225 | 0 | $Al_{88}La_4Ni_8$ | 183 | 183 | 0 |
| $Al_{86}Ni_6Y_{4.5}Co_2La_{1.5}$ | 232 | 240 | 8 | $Al_{88}La_5Ni_7$ | 206 | 206 | 0 |
| $Al_{86}Ni_7Y_5Co_1La_1$ | 227 | 233 | 6 | $Al_{87}La_4Ni_9$ | 205 | 205 | 0 |
| $Al_{86}Ni_7Y_{4.5}Co_1La_{1.5}$ | 231 | 246 | 15 | $Al_{87}La_5Ni_8$ | 220 | 220 | 0 |
| $Al_{87}Ni_{10}Zr_3$ | 179 | 179 | 0 | $Al_{86}La_5Ni_9$ | 234 | 249 | 15 |
| $Al_{86}Ni_{10}Zr_4$ | 235 | 235 | 0 | $Al_{86}La_6Ni_8$ | 245 | 259 | 14 |
| $Al_{86}Ni_9Zr_5$ | 216 | 216 | 0 | $Al_{85}La_6Ni_9$ | 256 | 272 | 16 |
| $Al_{85}Ni_{10}Zr_5$ | 242 | 242 | 0 | $Al_{85}La_5Ni_{10}$ | 243 | 260 | 17 |
| $Al_{8.75}Y_7Fe_5Ti_{0.5}$ | 275 | 310 | 35 | $Al_{84}La_5Ni_{11}$ | 265 | 282 | 17 |
| $Al_{87}Y_7Fe_5Ti_1$ | 270 | 340 | 70 | $Al_{84}La_6Ni_{10}$ | 273 | 289 | 16 |
| $Al_{86}Y_7Fe_5Ti_2$ | 280 | 350 | 70 | $Al_{84.5}Ni_{5.5}Y_{10}$ | 207 | 244 | 37 |
| $Al_{88}Y_7Fe_5$ | 258 | 280 | 22 | | | | |
| $Al_{85}Y_8Ni_5Co_2$ | 267 | 297 | 30 | $Al_{89.5}Co_{3.5}Y_7$ | 187 | 187 | 0 |
| $Al_{84}La_6Ni_{10}$ | 273 | 289 | 16 | $Al_{88}Co_4Y_8$ | 234 | 234 | 0 |
| $Al_{89}Co_6La_5$ | 248 | 248 | 0 | $Al_{86.5}Co_{4.5}Y_9$ | 270 | 290 | 20 |
| $Al_{90}Fe_5La_5$ | 235 | 235 | 0 | $Al_{85}Co_5Y_{10}$ | 314 | 314 | 0 |
| $Al_{82}Zr_5Ni_{13}$ | 283 | 283 | 0 | $Al_{86}Y_{4.5}Ni_8La_{1.5}$ | 234 | 245 | 11 |
| $(Al_{86}Ni_9La_5)_{98}Zr_2$ | 259 | 272 | 13 | | | | |

Table 2 shows glass transition temperatures, crystalline temperatures, and supercooled liquid regions of the cerium-based metallic glass, strontium-based metallic glass, gold-based metallic glass, ytterbium metallic glass, zinc-based metallic glass, calcium-based metallic glass, magnesium-based metallic glass, platinum-based metallic glass, and palladium-based metallic glass.

TABLE 2

| Metallic glass | Tg (° C.) | Tc (° C.) | ΔTx (K) | Metallic glass | Tg (° C.) | Tc (° C.) | ΔTx (K) |
|---|---|---|---|---|---|---|---|
| $Ce_{70}Al_{10}Cu_{20}$ | 68 | 128 | 60 | $Yb_{64}Zn_{20}Mg_{15}Cu_1$ | 84 | 129 | 45 |
| $Ce_{68}Al_{10}Cu_{20}Nb_2$ | 68 | 149 | 81 | $Au_{49}Cu_{26.9}Ag_{5.5}Pd_{2.3}Si_{16.3}$ | 128 | 186 | 58 |
| $Sr_{60}Mg_{18}Zn_{22}$ | 58 | 101 | 43 | $Yb_{70}Zn_{20}Mg_{10}$ | 74 | 113 | 39 |
| $Sr_{60}Li_{11}Mg_9Zn_{20}$ | 26 | 50 | 24 | $Yb_{62.5}Zn_{20}Mg_{17.5}$ | 94 | 125 | 31 |
| $Sr_{60}Li_5Mg_{15}Zn_{20}$ | 42 | 63 | 21 | $Yb_{64}Zn_{20}Mg_{15}Cu_1$ | 84 | 129 | 45 |
| $Sr_{60}Mg_{20}Zn_{15}Cu_5$ | 62 | 101 | 39 | $Yb_{65}Zn_{20}Mg_{10}Cu_5$ | 111 | 146 | 35 |
| $Sr_{40}Yb_{20}Mg_{20}Zn_{15}Cu_5$ | 63 | 105 | 42 | $Yb_{62.5}Zn_{15}Mg_{17.5}Cu_5$ | 108 | 128 | 20 |
| $Au_{50}Cu_{33}Si_{17}$ | 110 | 132 | 22 | $Zn_{40}Mg_{11}Ca_{31}Yb_{18}$ | 123 | 148 | 25 |
| $Au_{50}Cu_{25.5}Ag_{7.5}Si_{17}$ | 104 | 146 | 42 | $Zn_{40}Mg_{11}Ca_{35}Yb_{14}$ | 120 | 147 | 27 |
| $Au_{60}Cu_{15.5}Ag_{7.5}Si_{17}$ | 86 | 130 | 44 | $Ca_{65}Mg_{15}Zn_{20}$ | 102 | 137 | 35 |
| $Au_{65}Cu_{10.5}Ag_{7.5}Si_{17}$ | 69 | 119 | 50 | $Ca_{65}Li_{9.96}Mg_{8.54}Zn_{16.5}$ | 44 | 66 | 22 |
| $Au_{70}Cu_{5.5}Ag_{7.5}Si_{17}$ | 66 | 102 | 36 | $Mg_{65}Cu_{25}Y_{10}$ | 155 | 219 | 64 |
| $Ca_{65}Li_{9.96}Mg_{8.54}Zn_{16.5}$ | 44 | 66 | 22 | $Pt_{57.5}Cu_{14.7}Ni_{5.3}P_{22.5}$ | 236 | 325 | 89 |
| $Ce_{70}Cu_{20}Al_{10}$ | 68 | 135 | 67 | $Pt_{60}Ni_{15}P_{25}$ | 215 | 277 | 62 |
| $Pd_{43}Ni_{10}Cu_{27}P_{20}$ | 302 | 392 | 90 | | | | |

Table 3 shows glass transition temperatures, crystalline temperatures, and supercooled liquid regions of the zirconium-based metallic glass.

TABLE 3

| Metallic glass | Tg (° C.) | Tc (° C.) | ΔTx (K) | Metallic glass | Tg (° C.) | Tc (° C.) | ΔTx (K) |
|---|---|---|---|---|---|---|---|
| $Zr_{35}Ti_{30}Be_{30}Cu_5$ | 301.9 | 452.3 | 150.4 | $Zr_{30}Ti_{30}Be_{32}Cu_8$ | 318.2 | 463.0 | 144.8 |
| $Zr_{35}Ti_{30}Be_{27.5}Cu_{7.5}$ | 301.6 | 466.7 | 165.1 | $Zr_{30}Ti_{30}Be_{30}Cu_{10}$ | 323.0 | 467.4 | 144.4 |
| $Zr_{35}Ti_{30}Be_{26.75}Cu_{8.25}$ | 305.2 | 464.2 | 159 | $Zr_{35}Ti_{25}Be_{32}Cu_8$ | 323.5 | 462.4 | 138.9 |
| $Zr_{54}Ti_{11}Be_{22.5}Cu_{12.5}$ | 308 | 448 | 140 | $Zr_{35}Ti_{25}Be_{30}Cu_{10}$ | 322 | 473.1 | 151.1 |
| $Zr_{54}Ti_{11}Be_{17.5}Cu_{17.5}$ | 311 | 449 | 138 | $Zr_{35}Ti_{25}Be_{28}Cu_{12}$ | 323.3 | 471 | 147.7 |
| $Zr_{51}Ti_9Be_{27.5}Cu_{12.5}$ | 322 | 458 | 136 | $Zr_{40}Ti_{20}Be_{26.25}Cu_{13.75}$ | 316.5 | 467.8 | 151.3 |
| $Zr_{51}Ti_9Be_{25}Cu_{15}$ | 319 | 457 | 138 | $Zr_{35}Ti_{30}Be_{33}Co_2$ | 311.3 | 448 | 136.7 |
| $Zr_{40}Ti_{25}Be_{29}Cu_6$ | 306.7 | 455.1 | 148.4 | $Zr_{35}Ti_{30}Be_{31}Co_4$ | 315.7 | 467.4 | 151.7 |
| $Zr_{40}Ti_{25}Be_{27}Cu_8$ | 306.4 | 464.5 | 158.1 | $Zr_{35}Ti_{30}Be_{29}Co_6$ | 324.3 | 476.4 | 152.1 |
| $Zr_{40}Ti_{25}Be_{25}Cu_{10}$ | 306.4 | 470.2 | 163.8 | $Zr_{35}Ti_{30}Be_{33}Fe_2$ | 313.0 | 449.8 | 136.8 |
| $Zr_{27.5}Ti_{35}Be_{29.5}Cu_8$ | 317.9 | 455.6 | 137.7 | $Zr_{35}Ti_{30}Be_{31}Fe_4$ | 318.7 | 464.8 | 146.1 |
| $Zr_{32.5}Ti_{30}Be_{31.5}Cu_6$ | 317.4 | 466.7 | 149.3 | $Zr_{35}Ti_{30}Cu_{7.5}Be_{27.5}$ | 302.0 | 467.0 | 165.0 |
| $Zr_{32.5}Ti_{30}Be_{29.5}Cu_8$ | 314.7 | 472.1 | 157.4 | $Zr_{41.2}Ti_{13.8}Ni_{10}Cu_{12.5}Be_{22.5}$ | 350.0 | 439.0 | 89.0 |
| $Zr_{32.5}Ti_{30}Be_{27.5}Cu_{10}$ | 314.8 | 474.4 | 159.6 | | | | |
| $Zr_{37.5}Ti_{25}Be_{27.5}Cu_{10}$ | 311.0 | 471.1 | 160.1 | | | | |

The metallic glass may be included in an amount of about 0.1 to about 20 wt % based on the total amount of the conductive paste.

The conductive paste may further include a glass frit and/or crystalline powder including the same element as at least one element of the metallic glass, as an additive.

The organic vehicle may include an organic compound to impart viscosity to the conductive paste when mixed with the conductive powder, metallic glass and the additive, and a solvent capable of dissolving the conductive powder, the metallic glass, and the organic compound.

The organic compound may include, for example, at least one selected from a (meth)acrylate, a cellulose, e.g., ethyl cellulose, a phenol, an alcohol, tetrafluoroethylene (e.g., TEFLON®, a tetrafluoroethylene compound marked by Dupont Corporation), or a combination thereof, and may further include an additive, e.g., a surfactant, a thickener, a stabilizer, or a combination thereof.

The solvent may be any solvent that is capable of dissolving or suspending the above compounds and may include, for example, at least one selected from terpineol, butylcarbitol, butylcarbitol acetate, pentanediol, dipentyne, limonene, ethylene glycol alkylether, diethylene glycol alkylether, ethylene glycol alkylether acetate diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, or desalted water.

The organic vehicle may be included in a balance amount except for the solid components.

The conductive paste may be prepared by screen printing and firing, and may be used for manufacturing an electrode for an electronic device.

The electrode for an electronic device may include a sintered product of the conductive paste. The sintered product of the conductive paste may not have a glass transition temperature (Tg), different from the conductive paste and a sintered product of a glass frit.

The electrode may have contact resistance of less than or equal to about 1 kΩcm2. When the electrode has contact resistance within the range, power loss may be effectively decreased due to the electrode and efficiency of an electronic device, for example, a solar cell may be effectively improved. For example, the electrode may have contact resistance ranging from about 1 μΩcm2 to about 20 mΩcm2.

The electrode may have resistivity less than or equal to about 10 mΩcm. When the electrode has resistivity within the range, the electrode may effectively bring about less power loss and effectively improve efficiency of an electronic device, for example, a solar cell. For example, the electrode may have resistivity ranging from about 1 μΩcm to about 15 μΩcm.

Figure 5:
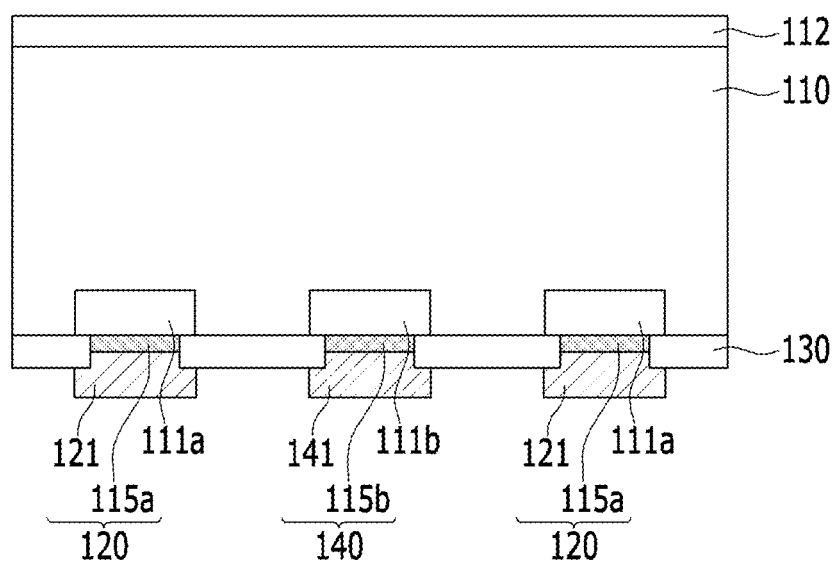
FIG. 5 is a cross-sectional view showing a solar cell according to example embodiments.

An example of the electronic device is a solar cell. FIG. 5 is a cross-sectional view showing a solar cell according to example embodiments.

Hereinafter, the spatial relationship of components will be described with respect to a semiconductor substrate 110 for better understanding and ease of description, but the present disclosure is not limited thereto. In addition, a solar energy incident side of the semiconductor substrate 110 is termed a front side and the opposite side is called a rear side, although alternative configurations are possible.

Referring to FIG. 5, a solar cell according to example embodiments may include a semiconductor substrate 110 doped with a p-type or n-type impurity.

The semiconductor substrate 110 may include a semiconductor, for example crystalline silicon or a compound semiconductor. The crystalline silicon may be, for example, a silicon wafer. The p-type impurity may be a Group III element, e.g., boron (B), and the n-type impurity may be a Group V element, e.g., phosphorus (P).

The front surface of the semiconductor substrate 110 may be surface textured. The surface textured semiconductor substrate 110 may have protrusions and depressions, e.g., a pyramid shape or a porous structure, e.g., a honeycomb shape. The surface textured semiconductor substrate 110 may increase the surface area to increase the light absorption rate and reduce reflectance, thereby improving solar cell efficiency.

The semiconductor substrate 110 may include a first doping region 111a and a second doping region 111b on the rear side of the semiconductor substrate 110. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

An insulation layer 112 is formed on the semiconductor substrate 110. The insulation layer 112 may be formed of a material that absorbs less light and has an insulating property, for example, silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), and a combination thereof, and may be formed of a single layer or multiple layers. The insulation layer 112 may have a thickness of about 200 to 1500 Å.

The insulation layer 112 may be an anti-reflective coating (ARC) that decreases the reflectivity of light and increases selectivity of a particular wavelength region on the surface of the solar cell, and simultaneously improves properties of silicon on the surface of the semiconductor substrate 110, thereby increasing efficiency of the solar cell.

A passivation layer 130 including a plurality of contact holes may be disposed on the rear side of the semiconductor substrate 110. The passivation layer 130 may be made of silicon oxide, silicon nitride, and/or aluminum oxide.

On the rear side of the semiconductor substrate 110, a first electrode 120 electrically connected to the first doping region 111a and a second electrode 140 electrically connected to the second doping region 111b are respectively formed. The first electrode 120 may contact the first doping region 111a through contact holes of the passivation layer 130, while the second electrode 140 may contact the second doping region 111b through contact holes of the passivation layer 130. The first electrode 120 and the second electrode 140 may be alternately disposed.

The first electrode 120 may include a first buffer portion 115a in a region contacting a first doping region 111a and a first electrode portion 121 in the regions other than the first buffer portion 115a. The second electrode 140 may include a second buffer portion 115b in a region contacting a second doping region 111b and a second electrode portion 141 in the regions other than the second buffer portion 115b.

The first electrode 120 and the second electrode 140 may be formed of the aforementioned conductive paste. However, the first and second electrodes 120 and 140 are not limited thereto, and either of the first electrode 120 and the second electrode 140 may be formed of the aforementioned conductive paste.

The first buffer portion 115a and the second buffer portion 115b may be formed from a softened metallic glass of the conductive paste and are thus conductive. The first buffer portion 115a may respectively contact the first doping region 111a and the first electrode portion 121, and thus enlarge the area of a path through which charges move from the first doping region 111a to the first electrode portion 121 and prevent or reduce loss of the charges. Likewise, the second buffer portion 115b may respectively contact the second doping region 111b and the second electrode portion 141, and thus enlarge the area of a path through which charges move from the second doping region 111b to the second electrode portion 141 and prevent or reduce loss of the charges.

According to example embodiments, a solar cell may include both of the first electrode 120 and the second electrode 140 on the rear side, and thus has a smaller area for a metal on the front side, decreasing light absorption loss and improving efficiency.

Figure 7A:
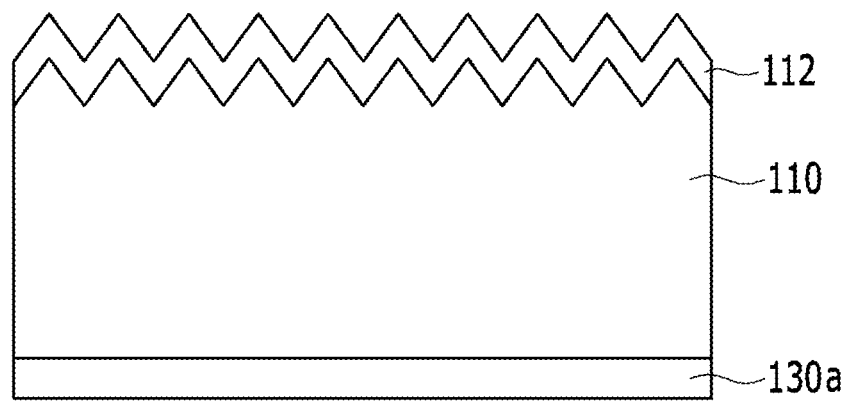
FIGS. 7A to 7E are cross-section views showing a method of fabricating a solar cell according to example embodiments.

Hereinafter, the method of manufacturing a solar cell according to example embodiments is described with reference to FIGS. 7A to 7E. First, as shown in FIG. 7A, a semiconductor substrate 110 doped with, for example, an n-type impurity, is prepared. The semiconductor substrate 110 may be surface-textured, and an insulation layer 112 and passivation layer 130a may be disposed on the front and rear sides of the semiconductor substrate 110, respectively. The insulation layer 112 and the passivation layer 130a may be provided by chemical vapor deposition (CVD), for example.

Figure 7B:
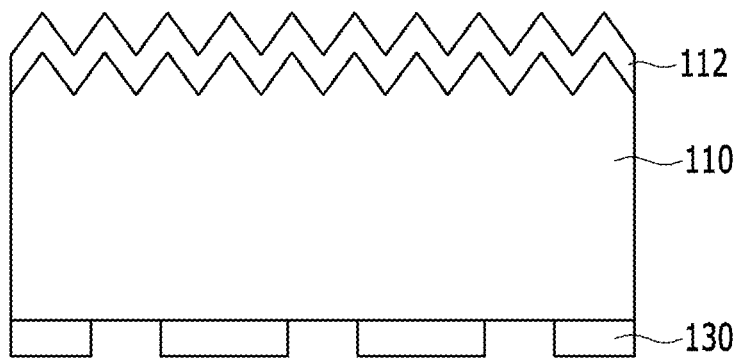
Figure 7C:
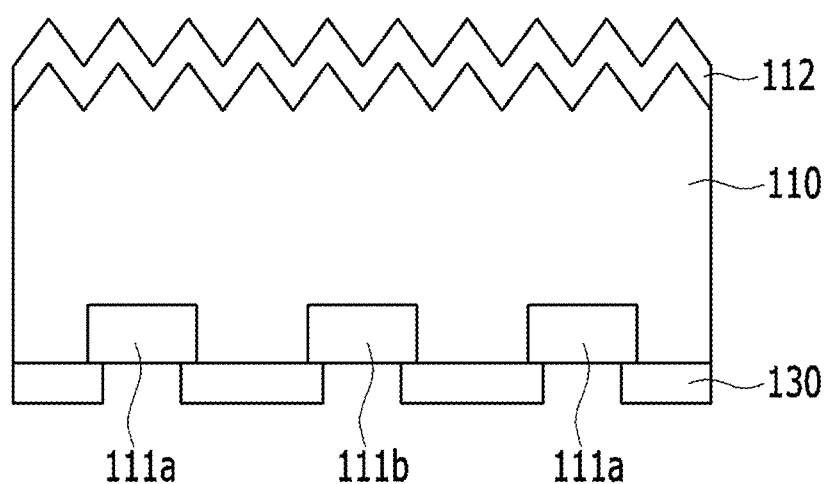

Then, referring to FIG. 7B, the passivation layer 130a may be patterned into a passivation layer 130 that exposes portions on the rear side of the semiconductor substrate 110. Referring to FIG. 7C, the first doping region 111a and the second doping region 111b may be formed by sequentially doping a p-type impurity and an n-type impurity at a relatively high concentration on portions of the rear side of the semiconductor substrate 110 that are exposed by the passivation layer 130a. For example, the first doping region 111a and the second doping region 111b may each have a higher impurity concentration than an impurity concentration of the substrate 110.

Alternatively, in example embodiments, the first doping region 111a and the second doping region 111b may be formed in the rear side of the semiconductor substrate 110 prior to forming the passivation layer 130/130a on the rear side of the semiconductor substrate. For example, a lithography pattern may be formed to expose portions of the substrate 110, and impurities may be subsequently implanted into the exposed portions of the substrate 110 in order to form the first doping region 11a and the second doping region 111b, respectively.

Figure 7D:
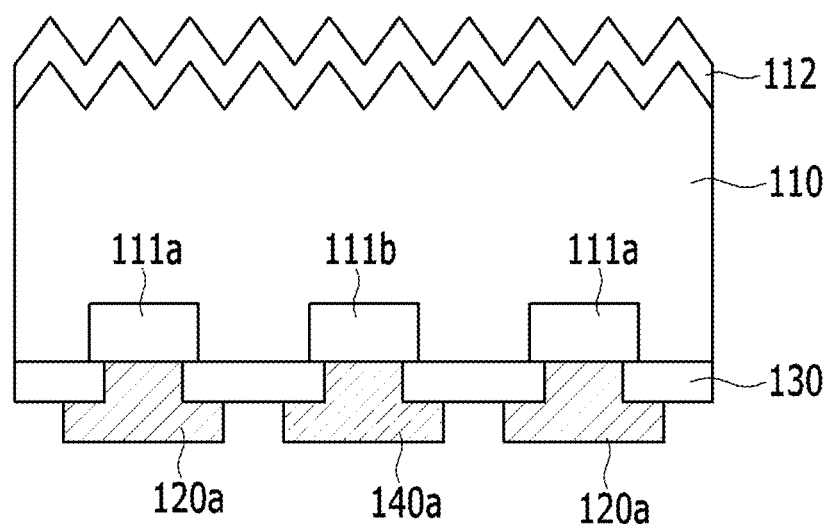

Then, referring to FIG. 7D, a conductive paste 120a for forming at least one first electrode is applied on a portion of the passivation layer 130 corresponding to the first doping region 111a, and a conductive paste 140a for forming at least one second electrode is applied on a portion of the passivation layer 130 corresponding to the second doping region 111b. The conductive paste 120a for the forming first electrode and the conductive paste 140b for forming the second electrode may be disposed by a screen printing method. The conductive paste 120a for forming the first electrode may be one of the above-described conductive pastes according to example embodiments and the conductive paste 140a for forming the second electrode may be one of the above-described conductive pastes according to example embodiments, described with reference to FIGS. 1-4 and Tables 1-2. In example embodiments, a composition of a conductive paste 120a used to form the first electrode may be the same as or different than a composition of a conductive paste 140a used to form the second electrode. For example, in example embodiments, the metallic glass, conductive powder, and/or organic vehicle in a conductive paste 120a to form the first electrode may the same as or different than the metallic glass, conductive powder, and/or organic vehicle of a conductive paste 140a used to form the second electrode.

The conductive paste 120a for forming the first electrode and the conductive paste 120b for forming the second electrode may be fired together or separately.

Herein, the firing may be performed in a furnace at a furnace process temperature of lower than or equal to about 600° C. (and/or a temperature of lower than or equal to about 350° C.). When the firing is performed at a higher temperature than about 600° C., a passivation layer 130 may have defects. Defects in the passivation layer may remarkably deteriorate the efficiency of a solar cell.

Figure 7E:
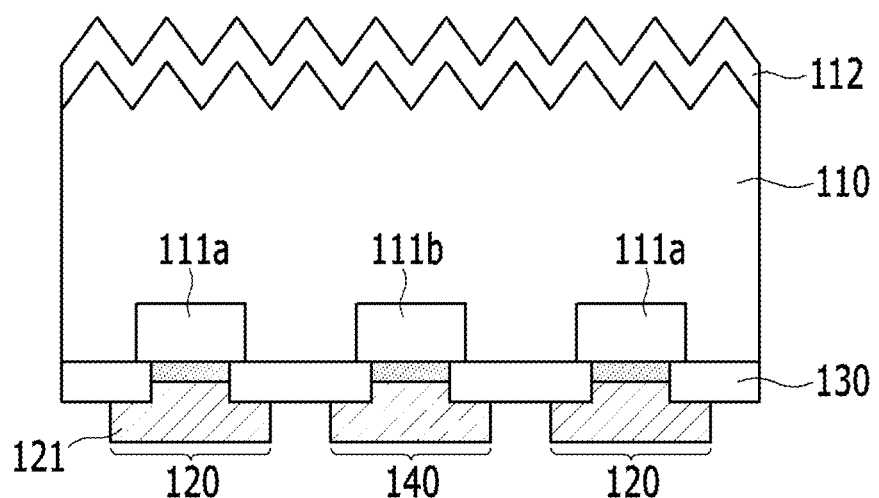

Referring to FIG. 7E, the first electrode 120 and the second electrode 140 structures may be formed on the rear surface of the semiconductor substrate 110 after the conductive pastes 120a and 140a described in FIG. 7D are fired.

As described above, a conductive paste according to example embodiments may include a metallic glass having a glass transition temperature of less than or equal to about 600° C., and when the conductive paste is heated at a lower temperature than about 600° C., the metallic glass becomes liquid-like. Accordingly, the conductive paste may be sufficiently wet against a semiconductor substrate.

The conductive paste may be applied to an electrode for a solar cell, but not limited thereto, and may be applied to form an electrode for other electronic devices such as a light-emitting device, an organic-based device, and the like. For example, the conductive paste may be used to form an electrode at the temperature of lower than or equal to about 600° C., and thus, may be efficiently applied to a flexible electronic device including a plurality of organic layers.

While FIGS. 5 and 7A to 7E describe a solar cell and a method of manufacturing a solar cell having first and second electrodes 120 and 140 on a rear side of the solar cell, example embodiments are not limited thereto.

The electrodes of one of more solar cells according to example embodiments may be electrically connected in series, parallel, and/or series-parallel with the electrodes of one or more solar cells according to example embodiments to form a solar cell module.

The following examples illustrate this disclosure in further detail. However, it is understood that this disclosure shall not be limited by these examples.

EXAMPLE

Silver (Ag) powder and metallic glass $Al_{84.5}Ni_{5.5}Y_{10}$ are added to an organic vehicle including an ethylcellulose binder, a surfactant, and a butylcarbitol/butylcarbitol acetate solvent. Herein, the silver (Ag) powder, the metallic glass $Al_{84.5}Ni_{55}Y_{10}$, and the organic vehicle are respectively mixed in an amount of 82.58 wt %, 3.93 wt %, and 13.49 wt % based on the total amount of the conductive paste.

Then, the mixture is kneaded with a 3-roll mill, preparing a conductive paste. The conductive paste is coated on a silicon wafer 110 by a screen printing method. The coated conductive paste is heated to about 600° C. using a belt furnace. The heated conductive paste is cooled down, fabricating an electrode sample.

Comparative Example 1

An electrode sample is fabricated by preparing a conductive paste according to the same method as the example, except for using glass frit having a glass transition temperature of less than or equal to about 450° C. instead of the metallic glass $Al_{84.5}Ni_{5.5}Y_{10}$.

Comparative Example 2

An electrode sample is fabricated by preparing a conductive paste according to the same method as the example, except for using $Ni_{60}Nb_{30}Ta_{10}$ having a glass transition temperature of about 650° C. instead of the metallic glass $Al_{84.5}Ni_{5.5}Y_{10}$.

Evaluation-1

The electrode sample according to the example is examined using a transmission electron microscope (TEM).

Figure 6:
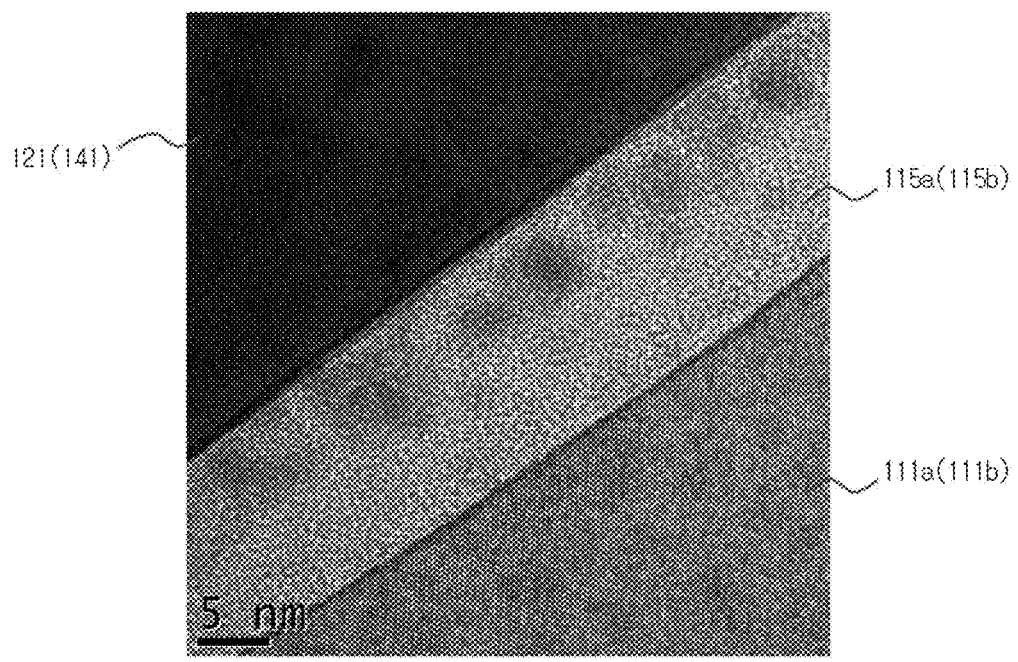
FIG. 6 is a transmission electron microscope (TEM) photograph showing an electrode according to an example.

FIG. 6 is the transmission electron microscope (TEM) photograph of the electrode according to the example.

Referring to FIG. 6, a buffer portion 115a, 115b is formed between a silicon wafer 111a, 111b and an electrode portion 121, 141 including silver (Ag) as a main component. The buffer portion 115a includes both silver (Ag) and aluminum (Al), which is identified through energy dispersive X-ray spectroscopy (EDS) of a transmission electron microscope (TEM).

Evaluation-2

The conductivity of the electrode samples according to the example and Comparative Examples 1 and 2 are measured.

The conductivity is calculated by using resistivity and contact resistance. The resistivity is calculated by measuring the electrode cross-section with a laser confocal microscope after measuring line resistance with a 2-point probe. The contact resistance is calculated by a transmission line method (TLM).

The results are provided in Table 4.

TABLE 4

|  | Resistivity ($\mu\Omega$cm) | Contact resistance (m$\Omega$m$^2$) |
| --- | --- | --- |
| Example | 3.49 | 1.58 |
| Comparative Example 1 | 8.70 | 45.0 |
| Comparative Example 2 | >25 | Not measured because the electrode is not adhered to the substrate (>100) |

As shown in Table 4, the electrode according to the example has lower resistivity and contact resistance than the one according to the comparative examples.

The electrode according to the example is fired at a relatively low temperature of about 600° C. but has sufficiently low resistivity and contact resistance and improved resistivity and contact resistance compared with the electrode fabricated by using a conductive paste including glass frit.

On the other hand, the electrode according to Comparative Example 2 is not fabricated at a relatively low temperature of about 600° C., and thus was not measured regarding conductivity.

While this disclosure has been described in connection with what is presently considered to be practical example embodiments, it is to be understood that the present disclosure is not limited to the disclosed embodiments, but, on the contrary, is intended to cover various modifications and equivalent arrangements included within the spirit and scope of the appended claims.

What is claimed is:

1. A conductive paste comprising:
  a conductive powder;
  an organic vehicle; and
  a metallic glass,
    the metallic glass being an alloy including at least two elements and not being formed of an oxide,
    the metallic glass having a glass transition temperature of less than or equal to about 600° C., and
    the metallic glass having a supercooled liquid region of greater than or equal to about 0 K; and
    the metallic glass including at least one of an aluminum-based metallic glass, a cerium-based metallic glass, a strontium-based metallic glass, a gold-based metallic glass, a zinc-based metallic glass, a calcium-based metallic glass, a magnesium-based metallic glass, a platinum-based metallic glass, a palladium-based metallic glass, and a zirconium-based metallic glass.

2. The conductive paste of claim 1, wherein the metallic glass includes the aluminum-based metallic glass.

3. The conductive paste of claim 2, wherein the glass transition temperature of the metallic glass ranges from about 10° C. to about 400° C.

4. The conductive paste of claim 2, wherein the supercooled liquid region of the metallic glass ranges from about 0 K to about 200 K.

5. The conductive paste of claim 2, wherein the metallic glass exists at least partly in an amorphous state.

6. The conductive paste of claim 2, wherein
  the metallic glass further includes at least one of nickel (Ni), yttrium (Y), cobalt (Co), lanthanum (La), zirconium (Zr), iron (Fe), and titanium (Ti).

7. The conductive paste of claim 2, wherein the conductive powder includes one of silver (Ag), aluminum (Al), copper (Cu), nickel (Ni), and a combination thereof.

8. The conductive paste of claim 2, wherein the conductive powder and the metallic glass are respectively included in an amount of about 30 wt % to about 99 wt %, about 0.1 wt % to about 20 wt %, and a remaining balance of the conductive paste is the organic vehicle.

9. An electronic device comprising:
  an electrode formed by sintering the conductive paste of claim 2.

10. The electronic device of claim 9, wherein the electronic device includes a flexible electronic device.

11. The electronic device of claim 9, wherein the electrode does not have a glass transition temperature (Tg).

12. The electronic device of claim 9, wherein
  the electrode further includes at least one of a glass frit and a crystalline powder, and
  the at least one of the glass frit and the crystalline powder contains an element that is the same as one of the at least two elements in the metallic glass.

13. The electronic device of claim 9, wherein a contact resistance of the electrode is less than or equal to about 1 kΩcm².

14. The electronic device of claim 9, wherein a resistivity of the electrode is less than or equal to about 10 mΩcm.

15. The electronic device of claim 9, wherein
  the metallic glass further includes at least one of nickel (Ni), yttrium (Y), cobalt (Co), lanthanum (La), zirconium (Zr), iron (Fe), and titanium (Ti).

16. The electronic device of claim 9, wherein the electronic device includes a solar cell.

17. A solar cell comprising:
  a semiconductor substrate; and
  at least one electrode electrically connected to the semiconductor substrate,
  the at least one electrode formed by sintering the conductive paste according to claim 2.

18. The solar cell of claim 17, wherein
  the at least one electrode includes first and second electrodes having different conductive types, and
  the first and second electrodes are positioned on a rear side of the semiconductor substrate, respectively.

19. The solar cell of claim 17, further comprising:
  a passivation layer on a rear side of the semiconductor substrate.

20. The solar cell of claim 17, wherein the at least one electrode includes:
  a buffer portion in a first region adjacent to the semiconductor substrate; and
  an electrode portion in a second region different from a region where the buffer portion is formed, the electrode portion including a conductive material.

21. The solar cell of claim 20, wherein the buffer portion is conductive.

22. The solar cell of claim 17, wherein
  the metallic glass further includes at least one of nickel (Ni), yttrium (Y), cobalt (Co), lanthanum (La), zirconium (Zr), iron (Fe), and titanium (Ti).

23. The solar cell of claim 17, wherein a contact resistance of the at least one electrode is less than or equal to about 1 kΩcm².

24. The solar cell of claim 17, wherein a resistivity of the at least one electrode is less than or equal to about 10 mΩcm.

25. The solar cell of claim 17, wherein the at least one electrode does not have a glass transition temperature (Tg).

26. The solar cell of claim 17, wherein
  the conductive paste further includes at least one of a glass frit and a crystalline powder, and
  the at least one of the glass frit and the crystalline powder contains an element that is the same as an element of the metallic glass.

27. A conductive paste comprising:
  a conductive powder;
  an organic vehicle; and
  a metallic glass,
    the metallic glass being an alloy including at least two elements and not being formed of an oxide,
    the metallic glass having a glass transition temperature of less than or equal to about 350° C., and the metallic glass having a supercooled liquid region of greater than or equal to about 0 K; and the metallic glass including at least one of an aluminum-based metallic glass, a cerium-based metallic glass, a strontium-based metallic glass, a gold-based metallic glass, an ytterbium-based metallic glass, a zinc-based metallic glass, a calcium-based metallic glass, a magnesium-based metallic glass, a platinum-based metallic glass, and a palladium-based metallic glass.

28. The conductive paste of claim 27, wherein the metallic glass includes the aluminum-based metallic glass.

29. The conductive paste of claim 28, wherein the conductive powder and the metallic glass are respectively included in an amount of about 30 wt % to about 99 wt % and about 0.1 wt % to about 20 wt %, and a balance of the conductive paste includes the organic vehicle.

30. An electrode comprising:
a sintered product of the conductive paste according to claim 28.

31. A method of making an electrode comprising:
depositing the conductive paste of claim 1 on a semiconductor substrate; and
heating the conductive paste on the semiconductor substrate in a furnace at a process temperature that is greater than the glass transition temperature of the conductive paste and less than or equal to about 600° C.

32. The method of claim 31, wherein the heating the conductive paste on the semiconductor substrate includes converting an amorphous portion of the metallic glass into a crystalline portion of the metallic glass.

33. The method claim 31, wherein
the glass transition temperature of the metallic glass is less than or equal to about 400° C., and
the supercooled liquid region of the metallic glass is greater than OK and less than or equal to about 200 K.

34. The method of claim 31, wherein
the depositing the conductive paste on the semiconductor substrate includes screen printing the conductive paste onto the semiconductor substrate, and
the semiconductor substrate is part of a solar cell.

35. The method of claim 34, wherein the semiconductor substrate is silicon.

* * * * *